US 6,567,267 B1

(12) United States Patent
Wang

(10) Patent No.: US 6,567,267 B1
(45) Date of Patent: May 20, 2003

(54) APPARATUS CAPABLE OF AIR-FILTERING AND HEAT-DISSIPATING AND ADAPTED FOR USE IN A COMPUTER

(76) Inventor: Terry Wang, 66, Sec. 1, Show-Ming Rd., Taipei (TW)

( * ) Notice: Subject to any disclaimer, the term of this patent is extended or adjusted under 35 U.S.C. 154(b) by 0 days.

(21) Appl. No.: 10/076,776

(22) Filed: Feb. 14, 2002

(51) Int. Cl.[7] .................................................. H05K 7/20
(52) U.S. Cl. .................... 361/695; 55/467; 174/16.1; 454/184
(58) Field of Search ................................. 165/80.2, 80.3, 165/104.33; 55/467, 492, 500; 361/687, 695, 696, 697; 174/16.1

(56) References Cited

U.S. PATENT DOCUMENTS

| | | | | |
|---|---|---|---|---|
| 3,923,482 A | * | 12/1975 | Knab et al. ................... 55/412 |
| 5,120,919 A | * | 6/1992 | Bruges ........................ 200/289 |
| 5,514,036 A | * | 5/1996 | Lin ............................. 454/184 |
| 5,559,673 A | * | 9/1996 | Gagnon et al. ............. 361/695 |
| 5,917,698 A | * | 6/1999 | Viallet ........................ 361/695 |
| 2002/0173265 A1 | * | 11/2002 | Kipka et al. ................ 454/184 |

* cited by examiner

*Primary Examiner*—Harold Joyce
(74) *Attorney, Agent, or Firm*—Pitney, Hardin, Kipp & Szuch LLP

(57) ABSTRACT

A housing of a filtering and heat-dissipating apparatus is mounted in a computer housing, and has a cover connected to a front open end thereof and formed with multiple vent holes. A filter unit is removably disposed in the housing, and includes a casing with front and rear open sides, and a filter medium disposed in the casing. A fan unit includes at least one fan mounted in a fan housing that has an air input end connected to a rear open end of the housing, and an air output end opposite to the air input end. The fan unit is operable so as to draw external air into the computer housing via the filter unit such that the apparatus can filter air around the computer housing and dissipate heat generated by electronic components that are mounted in the computer housing.

9 Claims, 5 Drawing Sheets

APPARATUS CAPABLE OF AIR-FILTERING AND HEAT-DISSIPATING AND ADAPTED FOR USE IN A COMPUTER

BACKGROUND OF THE INVENTION

1. Field of the Invention

The invention relates to an apparatus capable of air-filtering and heat-dissipating, more particularly to an apparatus that is capable of air-filtering and heat-dissipating and that is adapted for use in a computer.

2. Description of the Related Art

With the indispensability of computers, many people now spend a large amount of their working hours operating their office computers such that air quality in the office is relatively poor. In order to maintain a good air quality in a closed working place, an additional air-filtering apparatus is usually required, thereby resulting in additional expense and space allocation.

SUMMARY OF THE INVENTION

Therefore, the object of the present invention is to provide an apparatus that is capable of air-filtering and heat-dissipating and that is adapted for use in a computer.

According to the present invention, an apparatus is adapted for filtering air around a computer housing and for dissipating heat generated by electronic components that are mounted in the computer housing, and comprises:

a housing adapted to be mounted in the computer housing, the housing having front and rear open ends, and a cover connected to the front open end so as to cover the front open end, the cover being formed with a plurality of vent holes;

a filter unit removably disposed in the housing, the filter unit including a casing with front and rear open sides, and a filter medium disposed in the casing; and a fan unit including a fan housing and at least one fan mounted in the fan housing, the fan housing having an air input end connected to the rear open end of the housing, and an air output end opposite to the air input end, the fan unit being operable so as to draw external air into the computer housing via the filter unit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
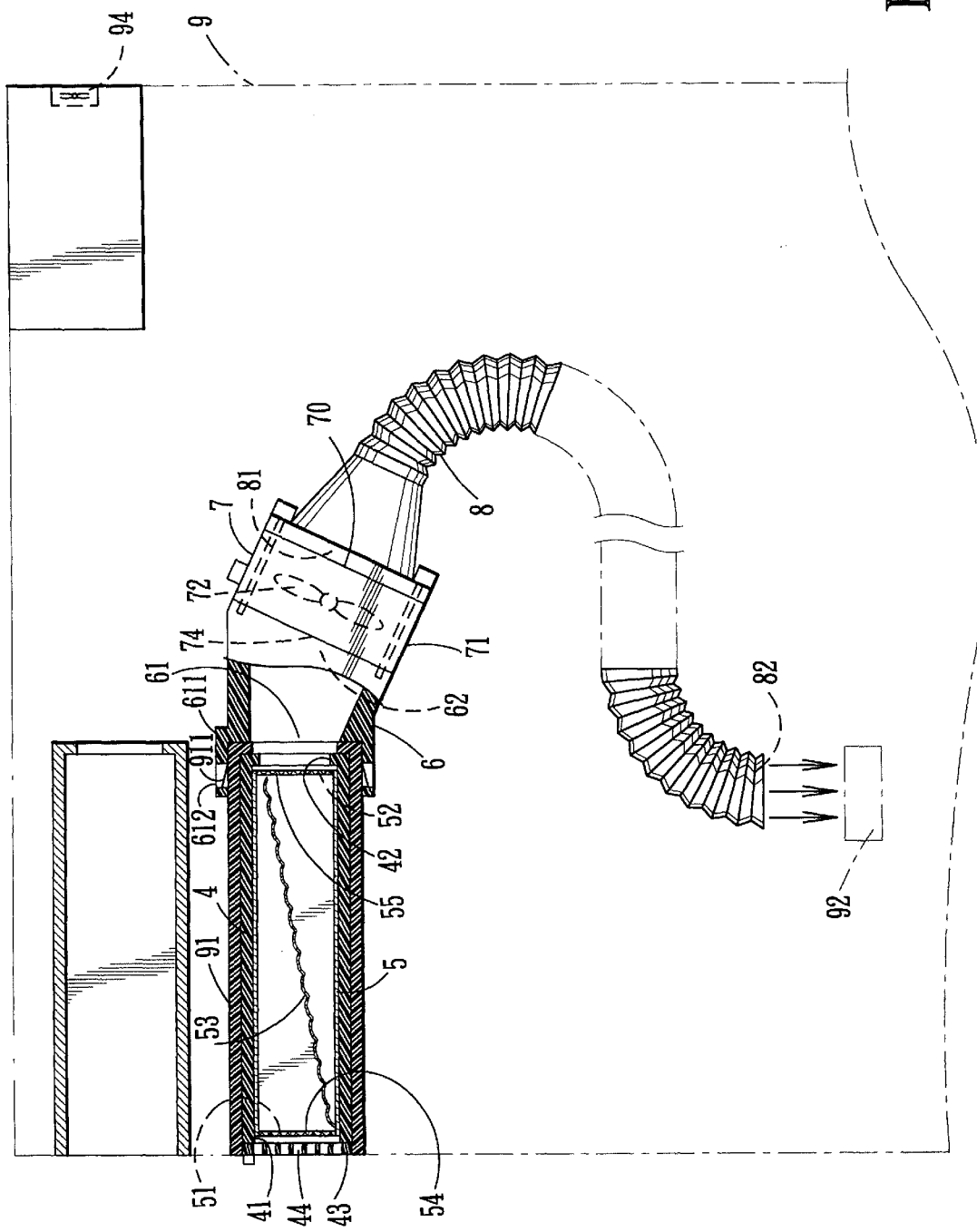
FIG. 1 is a partly schematic sectional, side view showing the first preferred embodiment of an apparatus according to the present invention.

Before the present invention is described in greater detail, it should be noted that like elements are denoted by the same reference numerals throughout the disclosure.

Referring to FIG. 1, according to the preferred embodiment of the present invention, an apparatus is adapted for filtering air around a computer housing 9 and for dissipating heat generated by electronic components 92 (only one is shown) that are mounted in the computer housing 9, and is shown to include a housing 4, a filter unit 5, a fan unit 7, and a flexible air pipe 8.

Figure 2:
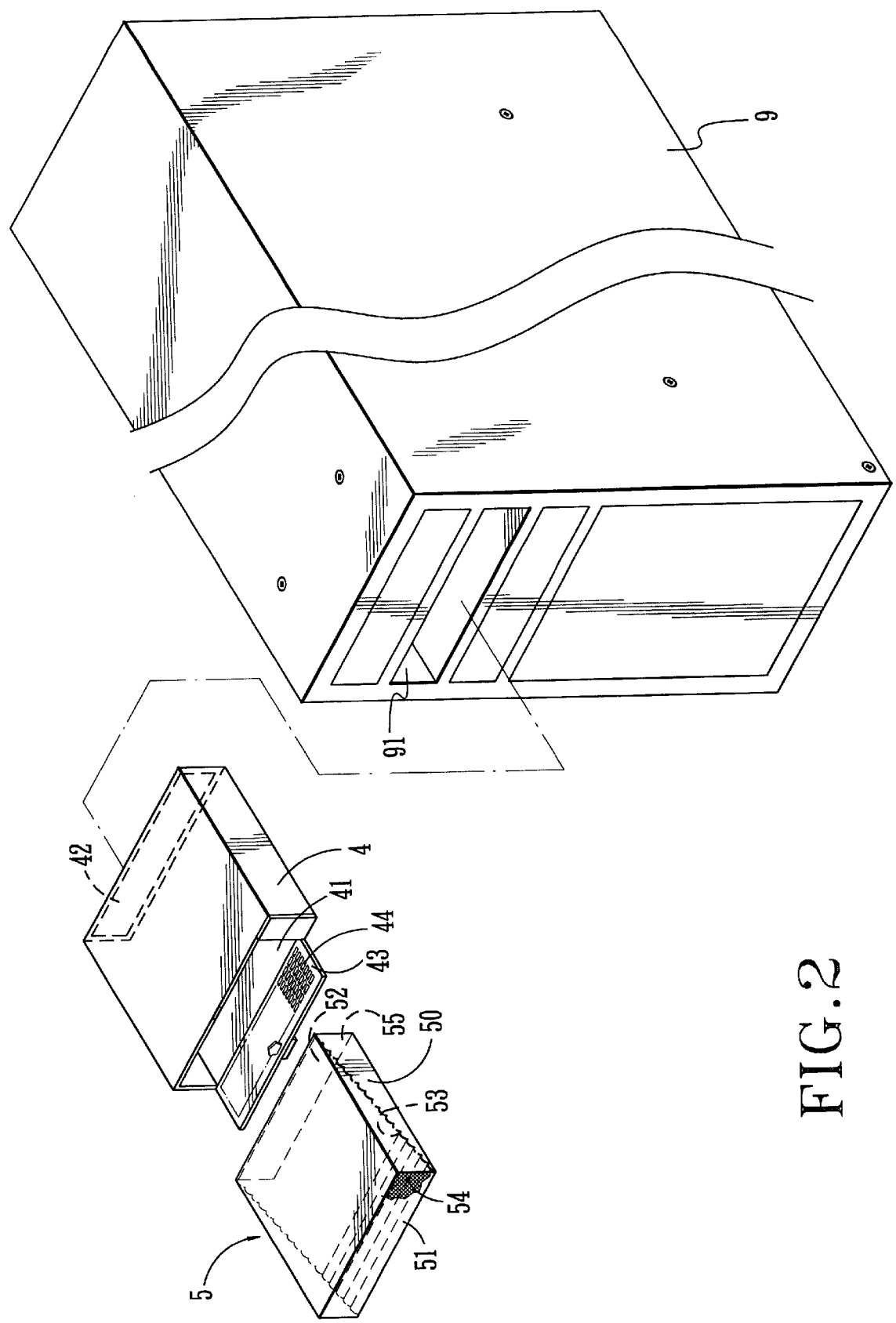
FIG. 2 is an exploded perspective view showing a filtering unit of the first preferred embodiment.

The housing 4 is adapted to be mounted on a rectangular frame body 91 in the computer housing 9 in a known manner, such as via the mounting arrangement for fixing a disk drive in the computer housing 9. Referring further to FIG. 2, the housing 4 has front and rear open ends 41, 42, and a cover 43 connected pivotally to the front open end 41 so as to cover the front open end 41. The cover 43 is formed with a plurality of vent holes 44.

The filter unit 5 is removably disposed in the housing 4. The filter unit 5 includes a casing 50 with front and rear open sides 51, 52, and a filter medium disposed in the casing 50. In this embodiment, the casing 50 is made of paper. The filter medium includes a filter net 53 that is corrugated and that extends inclinedly between the front and rear open sides 51, 52 of the casing 50. The filter unit 5 further includes a filter mesh 54, 55 provided at each of the front and rear open sides 51, 52 of the casing 50. Each of the filter net 53 and the filter mesh 54, 55 can be made of activated carbon or nonwoven fabric.

Figure 3:
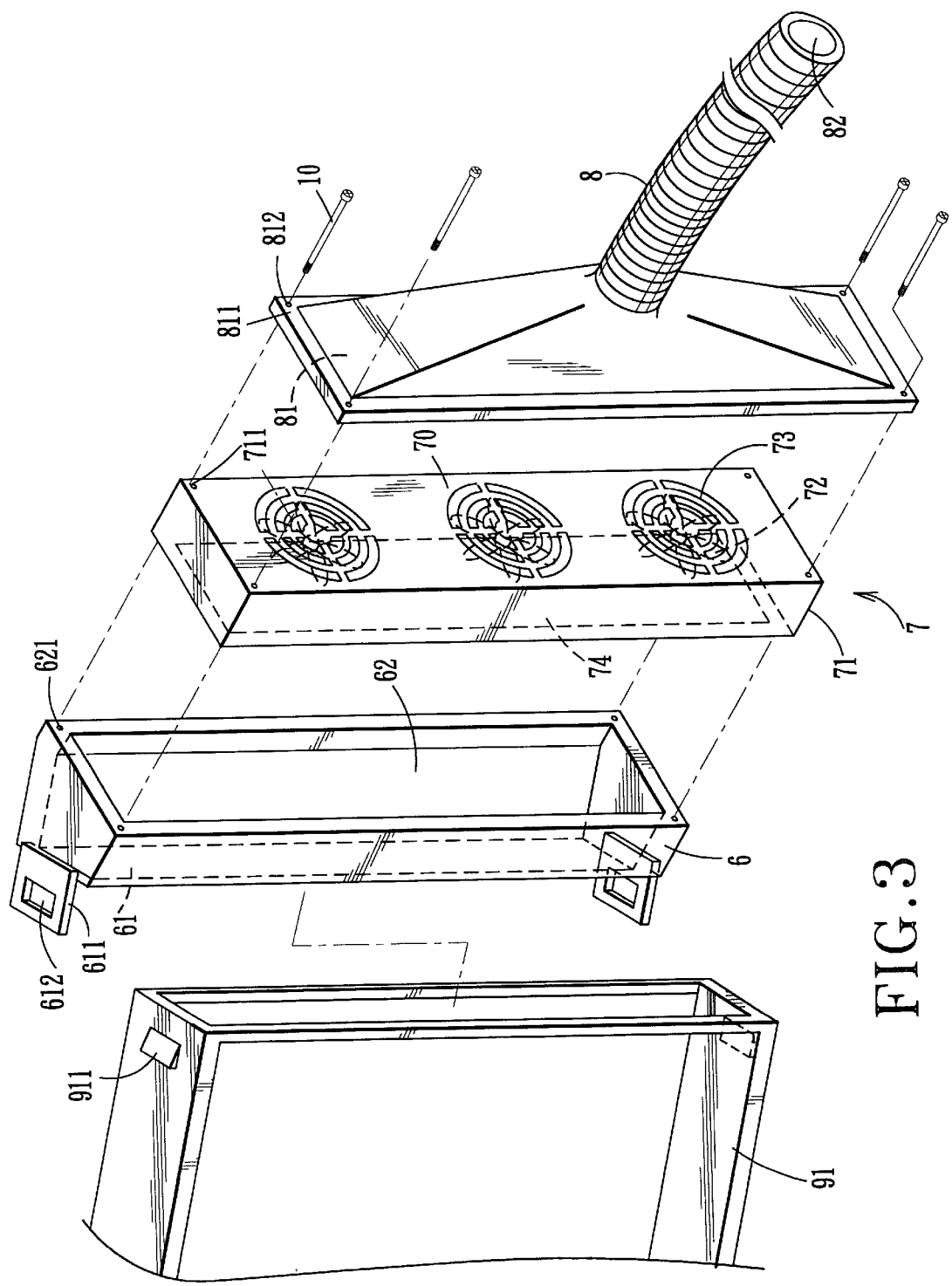
FIG. 3 is an exploded perspective view showing a fan unit of the first preferred embodiment.

Referring to FIG. 3, the fan unit 7 includes a fan housing 71 and three fans 72 mounted in the fan housing 71. In this embodiment, the fan housing 71 has an air input end 74 connected to the rear open end 42 of the housing 4 via a hollow coupler 6 that is adapted to be mounted on the frame body 91, and an air output end 70 opposite to the air input end 74. The air output end 70 is formed with three vent units 73, each of which is registered with a respective one of the fans 72. The coupler 6 has a first open end 61 adapted to be mounted on the frame body 91, and a second open end 62 opposite to the first open end 61 and abutting against the air input end 74. The first open end 61 has a smaller cross-section area than that of the second open end 62. The coupler 6 further has opposite lateral lugs 611 extending frontwardly from the first open end 61. Each lateral lug 611 is formed with an engaging hole 612 that is adapted to engage a respective one of a pair of outwardly projecting engaging ribs 911 formed on the frame body 91, thereby connecting the first open end 61 of the coupler 6 to the rear open end 42 of the housing 4 (see FIG. 1). The fan unit 7 is operable so as to draw external air into the computer housing 9 via the filter unit 5.

The air pipe 8 has a first end 81, which is in the form of a funnel, abutting against the air output end 70 of the fan housing 71, and a second end 82 opposite to the first end 81 and adapted to be disposed proximate to the electronic components 92 in the computer housing 9. A plurality of bolts 10 extend through a plurality of through holes 812 that are formed in a periphery 811 of the first end 81 of the air pipe 8 and a plurality of through holes 711 that are formed in the fan housing 71, and threadedly engage a plurality of threaded holes 621 that are formed in the second open end 62 of the coupler 6 such that the fan unit 7 and the first end 81 of the air pipe 8 are mounted on the coupler 6. Preferably, the fan unit 7 is connected to an internal power supply in the computer housing 9 such that, when the computer is in use, the fan unit 7 will be activated.

Therefore, when the fan unit 7 is activated, external air will be drawn into the computer housing 9 via the filter net 53, the filter meshes 54, 55 and the air pipe 8 for heat dissipating. Thereafter, the filtered air in the computer housing 9 can be extracted outwardly of the computer housing 9 via another fan 94 mounted in the computer housing 9. As such, air around the computer housing 9 can be filtered by the apparatus of this invention.

Figure 4:
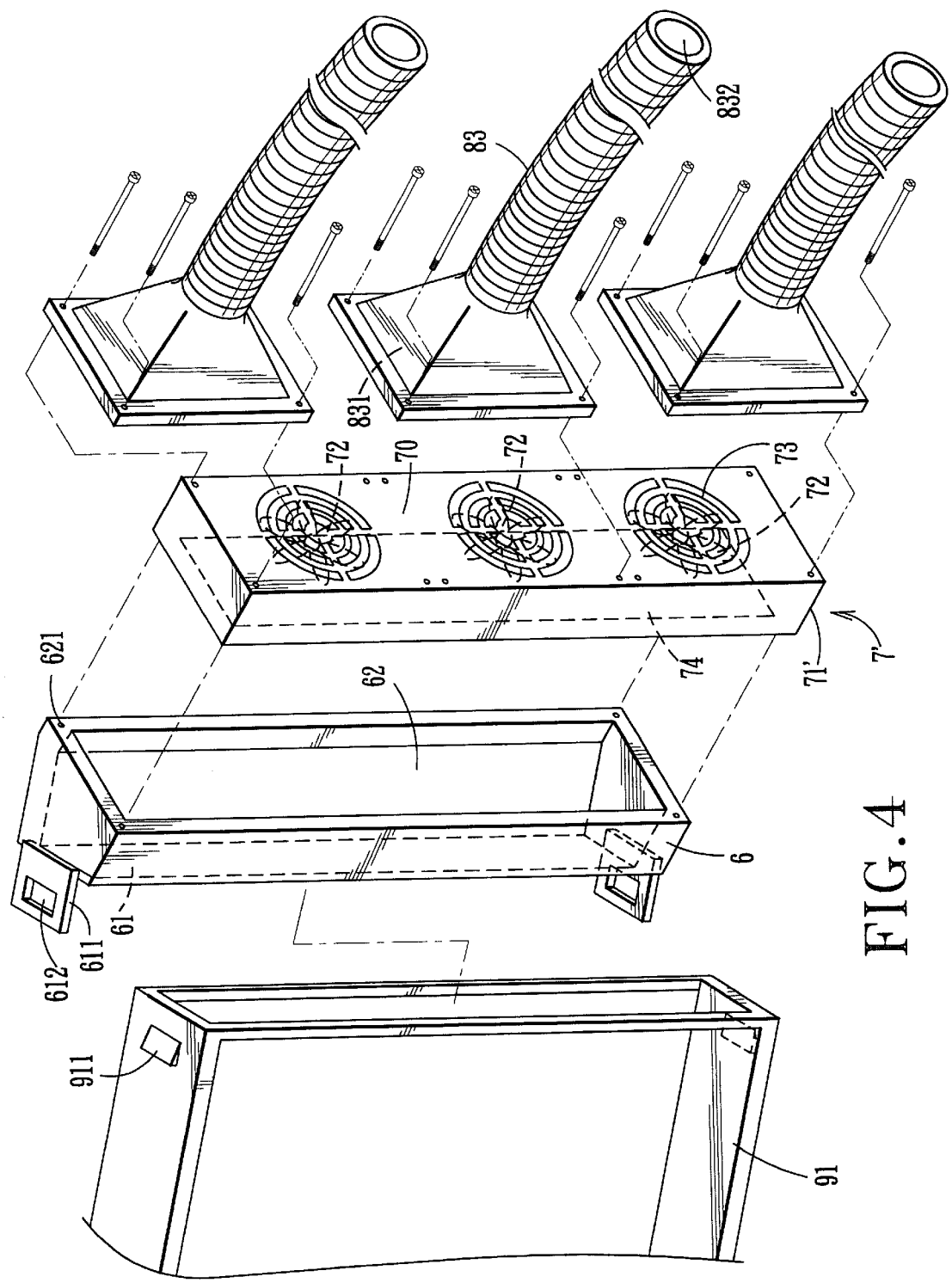
FIG. 4 is an exploded perspective view showing a fan unit of the second preferred embodiment of an apparatus according to the present invention.

FIG. 4 illustrates the second preferred embodiment of an apparatus according to the present invention, which is a modification of the first preferred embodiment. Unlike the previous embodiment, three flexible air pipes 83 are in use. Each of the air pipes 83 has a first end 831, which is in the form of a funnel, registered with a respective one of the vent units 73 formed in the fan housing 71' and connected to the air output end 70 of the fan housing 71' by means of a plurality of bolts, and a second end 832 opposite to the first end 831 and adapted to be disposed proximate to a respective electronic component (not shown) in the computer housing.

Figure 5:
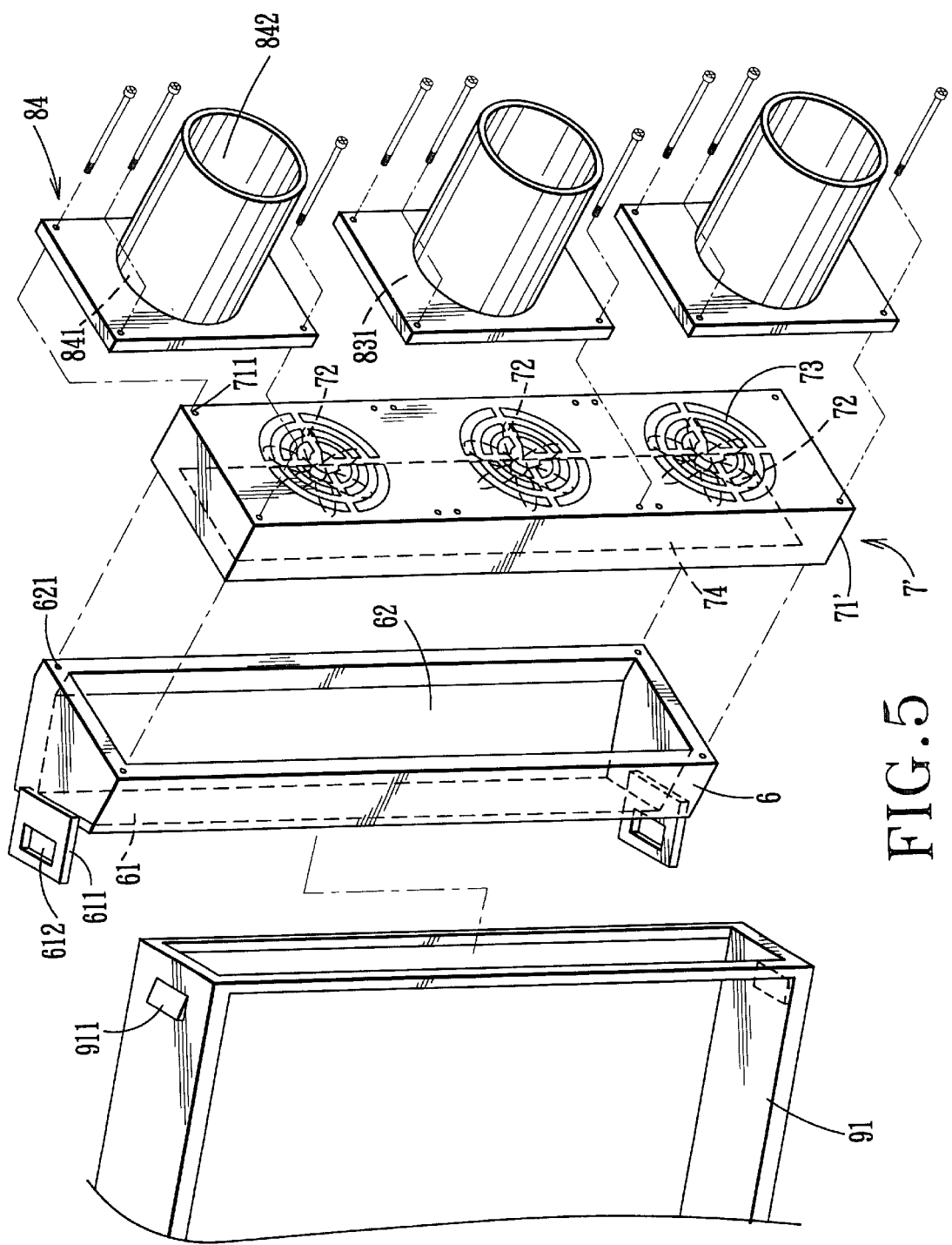
FIG. 5 is an exploded perspective view showing a fan unit of the third preferred embodiment of an apparatus according to the present invention.

FIG. 5 illustrates the third preferred embodiment of an apparatus according to the present invention, which is a modification of the first preferred embodiment. Unlike the previous embodiment, three rigid air pipes 84 are in use. Each of the air pipes 84 has a first end 841 connected to the air output end 70 of the fan housing 71' at a respective one of the vent units 73, and a second end 842.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An apparatus for filtering air around a computer housing and for dissipating heat generated by electronic components that are mounted in the computer housing, said apparatus comprising:

a housing adapted to be mounted in the computer housing, said housing having front and rear open ends, and a cover connected to said front open end so as to cover said front open end, said cover being formed with a plurality of vent holes;

a filter unit removably disposed in said housing, said filter unit including a casing with front and rear open sides, and a filter medium disposed in said casing; and a fan unit including a fan housing and at least one fan mounted in said fan housing, said fan housing having an air input end connected to said rear open end of said housing, and an air output end opposite to said air input end, said fan unit being operable so as to draw external air into the computer housing via said filter unit.

2. The apparatus as claimed in claim 1, wherein said filter medium includes a filter net that extends inclinedly between said front and rear open sides of said casing.

3. The apparatus as claimed in claim 2, wherein said filter net is corrugated.

4. The apparatus as claimed in claim 2, wherein said filter net is made of activated carbon.

5. The apparatus as claimed in claim 2, wherein said filter net is made of nonwoven fabric.

6. The apparatus as claimed in claim 1, wherein said filter unit further includes a filter mesh provided at at least one of said front and rear open sides of said casing.

7. The apparatus as claimed in claim 1, wherein said casing of said filter unit is made of paper.

8. The apparatus as claimed in claim 1, further comprising a flexible air pipe that has a first end connected to said air output end of said fan housing, and a second end opposite to said first end and adapted to be disposed proximate to the electronic components in the computer housing.

9. The apparatus as claimed in claim 1, further comprising a plurality of flexible air pipes, each of which has a first end connected to said air output end of said fan unit, and a second end opposite to said first end and adapted to be disposed proximate to a respective one of the electronic components in the computer housing.

* * * * *